(12) United States Patent
Rokhsaz

(10) Patent No.: US 6,956,905 B1
(45) Date of Patent: Oct. 18, 2005

(54) PEAK DETECTOR CIRCUIT

(75) Inventor: Shahriar Rokhsaz, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/533,206

(22) Filed: Mar. 23, 2000

(51) Int. Cl.$^7$ ............................................. H04L 25/00
(52) U.S. Cl. ...................... 375/257; 375/317; 375/318
(58) Field of Search ................... 375/257, 317, 375/318–319, 345, 316, 295, 259, 219; 327/103, 327/127, 133, 137, 178–180, 266, 274, 306–309, 327/312, 316–317, 323, 332, 334–335, 551, 327/553, 554, 566, 560–563, 50–54, 58, 327/65–67; 330/252, 253, 255, 257, 260, 330/264, 265, 271, 275, 278, 282, 254, 259, 330/288, 291, 307; 370/100, 108, 51–53, 370/58, 65–66

(56) References Cited

U.S. PATENT DOCUMENTS

| | | | | |
|---|---|---|---|---|
| 3,939,365 A | * | 2/1976 | Lindgren ..................... 327/59 |
| 4,535,294 A | * | 8/1985 | Ericksen et al. ............... 327/58 |
| 4,634,895 A | * | 1/1987 | Luong ......................... 327/62 |
| 4,926,442 A | * | 5/1990 | Bukowski et al. ........... 375/317 |
| 5,124,673 A | * | 6/1992 | Hershberger ................. 333/18 |
| 5,302,863 A | * | 4/1994 | Walley et al. ................ 327/60 |
| 5,331,210 A | * | 7/1994 | McCarroll .................... 327/58 |
| 5,451,902 A | * | 9/1995 | Huang et al. ............... 330/253 |
| 5,539,779 A | * | 7/1996 | Nagahori .................... 375/317 |
| 5,548,833 A | * | 8/1996 | Townsend ................. 455/234.1 |
| 5,581,212 A | * | 12/1996 | Huang et al. ............... 330/253 |
| 5,825,239 A | * | 10/1998 | Adal .......................... 327/563 |
| 5,852,637 A | * | 12/1998 | Brown et al. ............... 375/316 |
| 5,880,615 A | * | 3/1999 | Bazes ........................ 327/307 |
| 5,933,040 A | | 8/1999 | Rokhsaz et al. ............ 327/306 |
| 5,969,545 A | * | 10/1999 | Assadian et al. ............. 327/62 |
| 6,028,464 A | * | 2/2000 | Bremner ..................... 327/309 |
| 6,058,144 A | * | 5/2000 | Brown ....................... 375/316 |
| 6,134,279 A | * | 10/2000 | Soichi et al. ............... 375/341 |
| 6,169,452 B1 | * | 1/2001 | Popescu et al. ............. 330/254 |
| 6,191,879 B1 | * | 2/2001 | Yanagisawa ................ 398/210 |
| 6,218,905 B1 | * | 4/2001 | Sanders et al. ............. 330/308 |
| 6,272,185 B1 | * | 8/2001 | Brown ....................... 375/340 |
| 6,369,618 B1 | * | 4/2002 | Bloodworth et al. ........ 327/103 |
| 6,529,564 B1 | * | 3/2003 | Brown ....................... 375/318 |

* cited by examiner

Primary Examiner—Tesfaldet Bocure
Assistant Examiner—Khanh Tran
(74) Attorney, Agent, or Firm—Timothy Markison

(57) ABSTRACT

A balanced peak detector circuit adjusts differential voltage signals. In one embodiment, the peak detector uses competing current paths to provide a charging current to a storage capacitor. The charge on the storage capacitor is used to adjust either a transconductance or a transimpedance circuit. An offset current can be used to adjust the charge stored on the capacitor to change a peak-to-peak output voltage from the transimpedance circuit. In one embodiment, the offset current can be adjusted using an adjustable current source. A discharge circuit has been describe that allows a discharge of the capacitor to be controlled.

24 Claims, 7 Drawing Sheets

US 6,956,905 B1

PEAK DETECTOR CIRCUIT

TECHNICAL FIELD OF THE INVENTION

The present invention relates generally to signal processing and in particular the present invention relates to adjusting signal levels based upon peak voltages.

BACKGROUND OF THE INVENTION

The need for high speed signal processing is currently driven by the increase in communication speeds. High speed differential voltage signals are often used in communication systems. Receiving devices, therefore, need to be able to monitor and process the differential voltage signals. To minimize the constraints on the communication system, the voltage signal peak-to-peak voltage range is often allowed to vary. Thus, the receiver circuit needs to be adapted to process input voltage signals that have a wide range of peak voltages.

Internal circuitry of the receiver, however, often operates more efficiently if the voltage signals are maintained within a smaller peak-to-peak range. One approach to processing input voltage signals is to clamp the input signals within predetermined voltage levels. This approach is undesirable because it alters the profile of the input signals. Other processing techniques that are not balanced also change the profile of incoming differential voltage signals.

For the reasons stated above, and for other reasons stated below which will become apparent to those skilled in the art upon reading and understanding the present specification, there is a need in the art for circuitry that adjusts differential voltage signals using a balanced peak detector circuit.

SUMMARY OF THE INVENTION

The above-mentioned problems with processing differential voltage signals and other problems are addressed by the present invention and will be understood by reading and studying the following specification.

In one embodiment, a signal processing circuit comprises a voltage processor having first and second input nodes to receive differential input voltage signals, and first and second output nodes to provide first and second differential output signals having a first peak-to-peak voltage. A peak detector circuit is coupled to the first and second output nodes of the voltage processor. The peak detector circuit has an output node to provide a feed back signal to the voltage processor to adjust the first peak-to-peak voltage of the differential output signals. The peak detector circuit includes a storage device to store the feed back signal.

In another embodiment, an integrated circuit data receiver comprises first and second input nodes to receive differential input voltage signals having a first peak-to-peak voltage, and a voltage processor coupled to the first and second input nodes. The voltage processor has first and second output nodes to provide first and second differential output signals having a second peak-to-peak voltage. A peak detector circuit is coupled to the first and second output nodes of the voltage processor. The peak detector circuit has an output node to provide a feed back signal to the voltage processor to adjust the first peak-to-peak voltage of the differential input signals to the second peak-to-peak voltage. The peak detector circuit includes a storage device to store the feed back signal.

In yet another embodiment, a receiver circuit is provided to receive complementary voltage signals and adjusts a peak-to-peak voltage of the complementary voltage signals. The receiver circuit comprises a differential sensing circuit for detecting the peak-to-peak voltage of the complementary voltage signals, a storage device to store a voltage used to adjust the peak-to-peak voltage of the complementary voltage signals, an adjustment circuit to offset the voltage stored in the storage device, and a refresh circuit coupled to the storage device to adjust a refresh period of the storage device.

A method of adjusting voltage signals is provided in another embodiment. The method comprises detecting a first peak-to-peak voltage level of first and second differential input voltage signals, storing a charge on a capacitor representative of the first peak-to-peak voltage level of differential voltage signals, and adjusting a second peak-to-peak voltage level of first and second differential output voltage signals using the charge stored on the capacitor.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
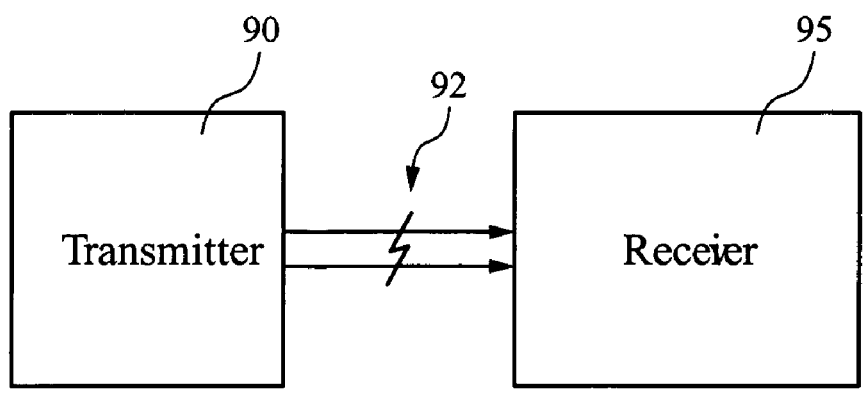
FIG. 1 is a block diagram of a basic transmitter/receiver circuit.
Figure 2:
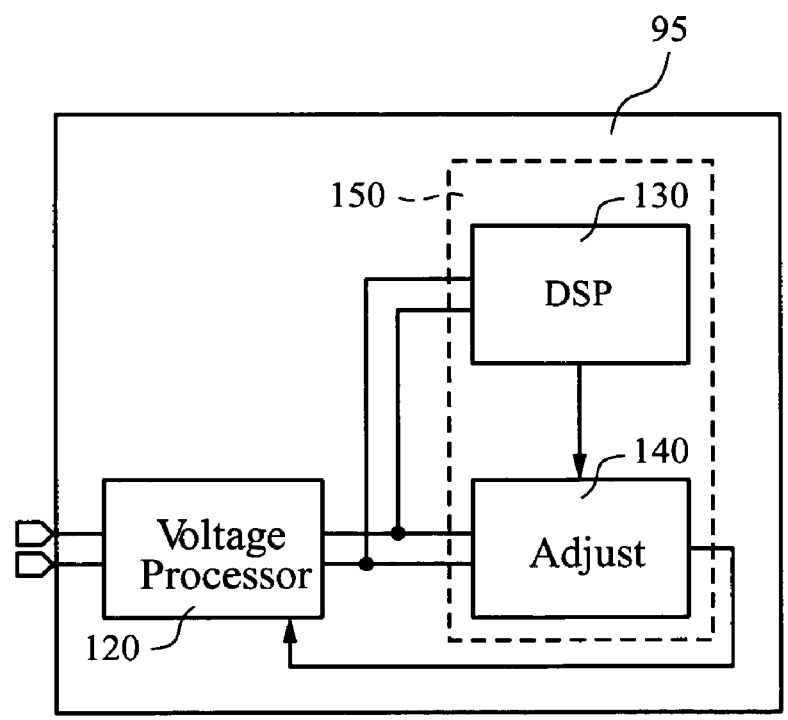
FIG. 2 illustrates one embodiment of the receiver of FIG. 1.

Referring to FIG. 1, a block diagram of a basic transmitter/receiver circuit is illustrated. The system includes a transmitter 90 that provides complementary voltage signals on bus 92 to a receiver 95. The receiver analyses the received voltage signals and may perform further processing. Some processing done on the received voltage signals is to adjust the voltage differential (peak-to-peak) of the received signal. As shown in FIG. 2, one embodiment of the receiver includes a voltage processor 120 that removes noise, or extraneous signals, from the received voltage signals. The peak-to-peak voltage is monitored and adjusted by a peak detector circuit. In one embodiment, the peak detector includes a digital signal processor (DSP) 130 and a voltage adjust circuit 140. The voltage adjust circuit of the peak detector provides a feedback signal to the voltage processor to adjust the peak-to-peak level of the processed voltage signals. The digital signal processor (DSP) 130 and the voltage adjust circuit 140 are part of the peak detection circuitry 150.

Figure 3:
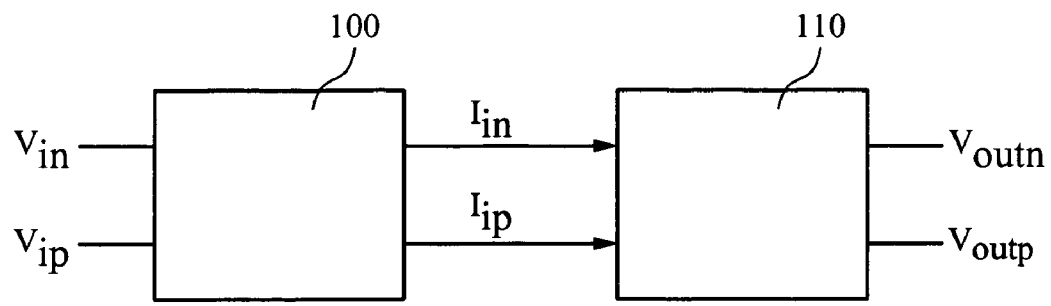
FIG. 3 is a block diagram of a prior art voltage signal processing circuit.

Referring to FIG. 3, a block diagram of a prior art voltage signal processing circuit is illustrated. The circuit includes an adjustable transconductance circuit 100 coupled to a transimpedance circuit 110. The transconductance circuit has first and second input connections, $V_{in}$ and $V_{ip}$, for receiving a differential input voltage signal. The transconductance circuit also has first and second output connections, $I_{in}$ and $I_{out}$, for providing differential output currents. That is, the transconductance circuit converts input voltages to output currents. The first and second output connections of the transconductance circuit are coupled to input connections of the transimpedance circuit. The transimpedance circuit converts the input current signals to output voltages at output nodes, Voutn and Voutp. This circuit, therefore, converts input differential voltages to differential output voltages. This conversion is performed to remove high frequency components which may be present on the input voltage signals. In other words, the input differential voltage signals are filtered through this conversion process. In one embodiment, the differential input signals can range from −2 to +2 volts.

Figure 4:
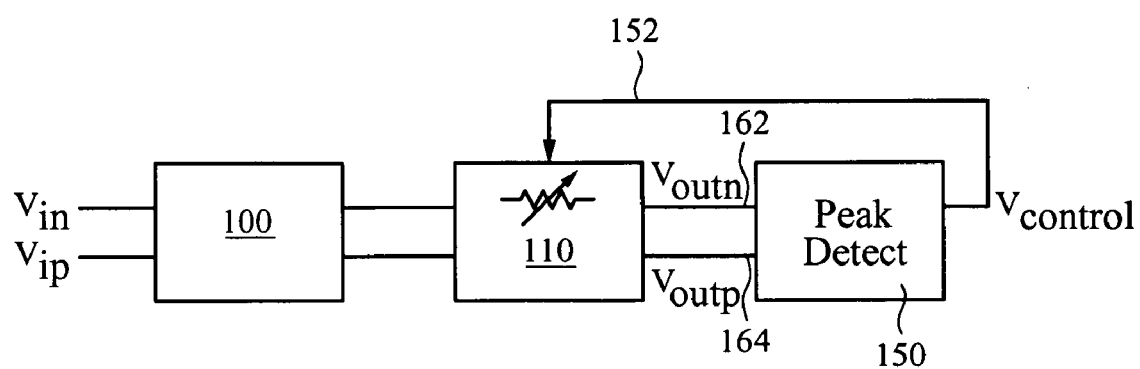
FIG. 4 illustrates one embodiment of an adaptive peak detection circuit of the present invention.

The differential output voltages provided by the transimpedance circuit are unregulated and need to be processed to a common mode input range. Referring to FIG. 4, an adaptive peak detection circuit 150 is coupled to the output connections of the transimpedance circuit to provide feedback 152 to the transimpedance circuit. The peak detection circuit monitors the output voltage signals provided by the transimpedance circuit and determines whether the output signals need to be increased or decreased in level. The peak detection circuit is a fully balanced peak detector that has substantially the same load (input impedance) provided on both input connections. Specific embodiments of the peak detection circuit are described below.

Figure 5:
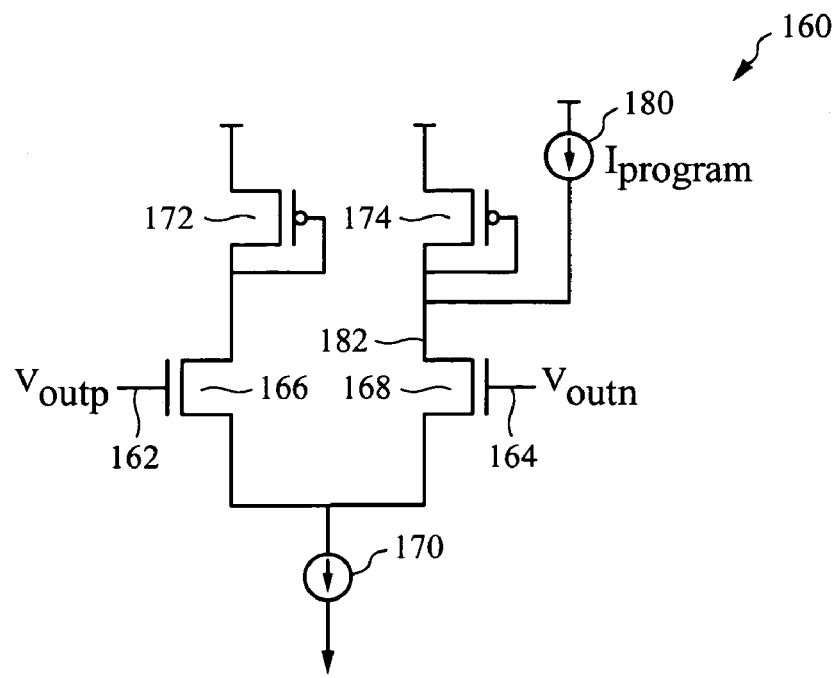
FIG. 5 illustrates one embodiment of an input circuit of a peak detector circuit.

Referring to FIG. 5, one embodiment of an input circuit 160 of a peak detector circuit is illustrated. The input circuit includes a first input connection 162 and a second input connection 164. The input connections can be coupled to receive the output voltage signals provided by the transimpedance circuit 110. As such, the input connections are labeled $V_{outn}$ and $V_{outp}$. It will be appreciated by those skilled in the art with the benefit of the present description that the input connections are balanced and the output signals from the transimpedance circuit can be switched with respect to input connections 162 and 164. Input connections 162 and 164 are gate connections of n-channel input transistors 166 and 168, respectively. Source connections of transistors 166 and 168 are coupled together and connected to a current source 170. A drain connection on transistor 166 is coupled to a source and gate connection of P-channel supply transistor 172. Transistor 172 is coupled to a supply node. It will be appreciated that the supply node is not limited to an upper supply voltage of an integrated circuit, but can be any appropriate voltage.

A drain connection of transistor 168 is coupled to a source and gate connection of P-channel supply transistor 174 at node 182. A controllable current source 180 is coupled to node 182. In an alternate embodiment, a second current source can be coupled to transistors 172 and 166 to maintain a fully balanced load with respect to input connections 162 and 164. A first current path is defined by the current path through transistors 172 and 166, a second current path is defined by transistors 174 and 168. Current source 180 is coupled to the second current path to provide, or inject, an offset current into the second current path.

In operation, a current through transistor 166 and a current through transistor 168 can be controlled. If the controllable current source 180 provides zero offset current, the current through transistor 166 and 168 are balanced. That is, when transistors 162 and 164 are equally turned on, ½ of the current conducted through current source 170 is conducted through transistor 166, and ½ of the current is conducted through transistor 168. As the current provided to node 182 by current source 180 increases, the amount of current conducted through pull-up transistor 174 is decreased. The current conducted through transistor 174 can be used to provide a feedback to the transimpedance circuit, as explained below with reference to FIG. 6. The input voltages are complementary and vary in potential over time. As such, the amount of current conducted through transistors 166 and 168 will vary. In other words, the ratio between the current paths change in relation to the input voltages. For example, if the peak-to-peak voltage is 2 volts one transistor (168) is turned on hard and the other (166) is turned off hard. The amount of current conducted through transistor 168 is substantially higher. Thus, more current is conducted through transistor 174. In contrast, if the peak-to-peak voltage is 100 mV, transistor 166 is not turned off hard and transistor 168 is not turned on hard. As a result, the current through transistor 168 is not as substantial. Thus, the current conducted through transistor 174 is less. As explained below, the amount of current conducted through transistor 174 is mirrored and used to adjust the voltage processor 120. At low input voltages current source 180 could be high enough to turn transistor 174 off. As such, capacitor 192 will not be charged through the current mirror. The current source therefore established a threshold voltage at which the circuit can adjust the input voltage.

Figure 6:
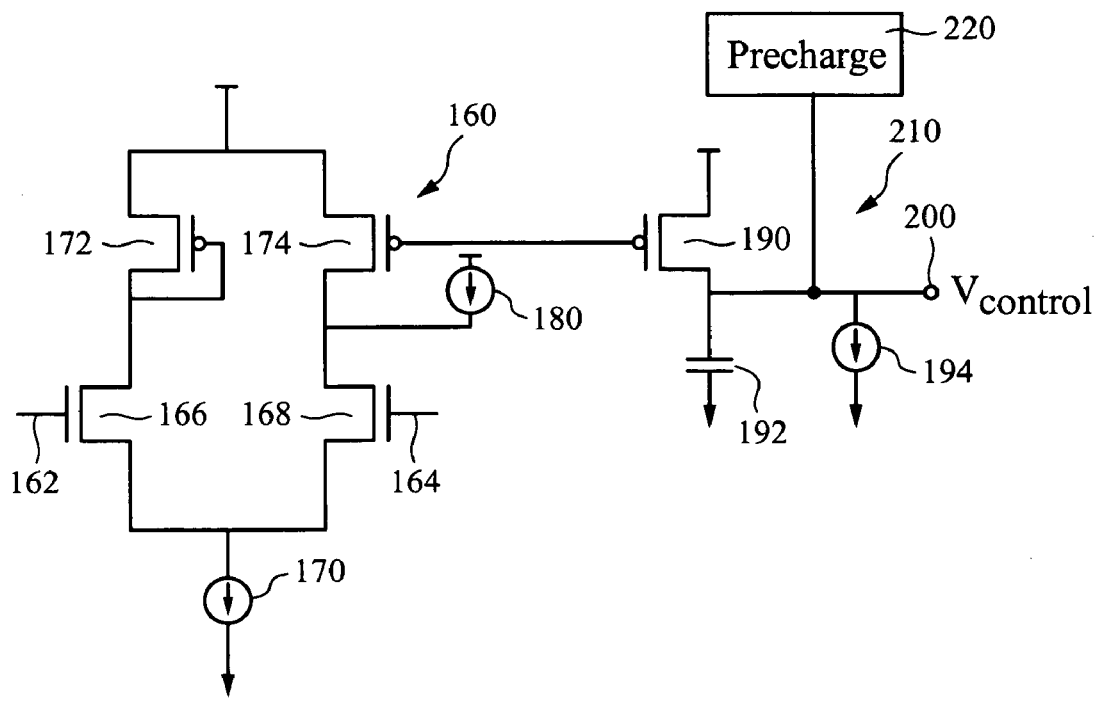
FIG. 6 illustrates a schematic diagram of an embodiment of a peak detector circuit.

FIG. 6 illustrates a schematic diagram of a peak detector circuit having input circuit 160 and a feedback circuit 210. The feedback circuit includes a P-channel transistor 190 with a gate connected to the gate of transistor 174 to operate as a current mirror. Transistor 190 is coupled to both storage device 192 and a decay current source 194 (refresh circuit). In this embodiment the storage device is a capacitor. Other storage devices can be used to store a voltage or digital data representative of the charging current conducted through transistor 190. Output control node 200 can be coupled to the transimpedance circuit 110 as illustrated, and labeled 152, in FIG. 4. In operation, a voltage is stored on capacitor 192 and provides the feedback voltage signal, as explained below. Current source 194 provides a small discharge current to discharge capacitor 192. The discharge current level is selected to allow for adjustments to the charge stored on capacitor 192.

Figure 7A:
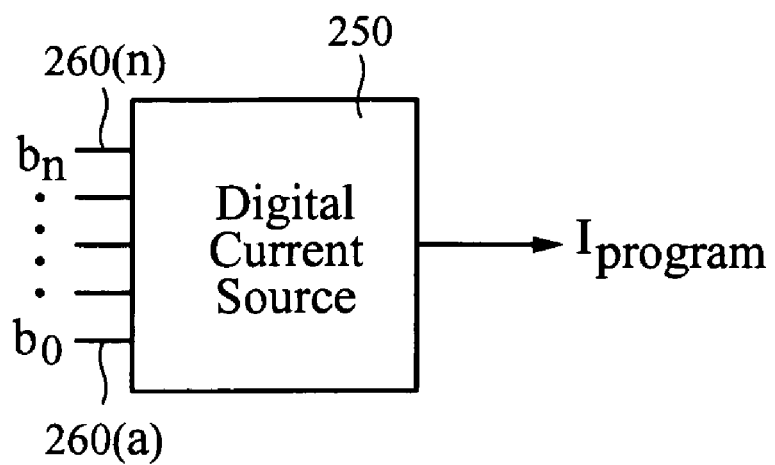
FIG. 7a illustrates a digital current source provided in one embodiment of the present invention.
Figure 7B:
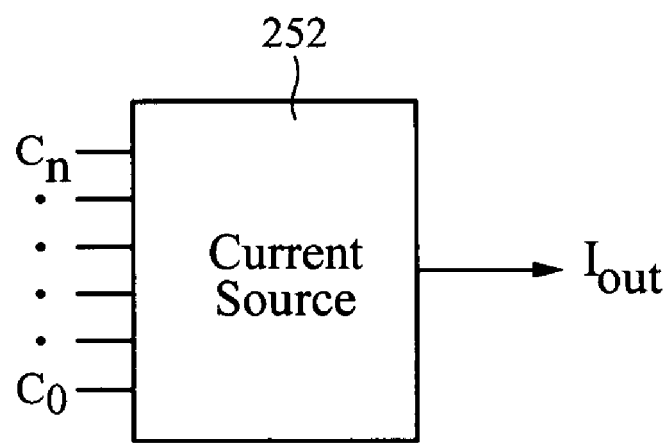
FIG. 7b illustrates another digital current source provided in one embodiment of the present invention.

By controlling current source 180, the amount of current conducted by transistor 190 is controlled and the charge stored on transistor 192 is also controlled. FIG. 7a illustrates a digital current source 250 that can be used as current source 180. The digital current source has inputs 260(a)–260(n) that are used to control the output current provided by the current source. The inputs for the current source can be selected in a variety of different ways. In one embodiment, the current source is controlled by a digital signal processor (DSP) that selects the appropriate inputs for the current source. The DSP can select the appropriate inputs through a training cycle using preamble data. That is, if the DSP does not detect a signal from the transimpedance circuit over a predetermined time period (such as a fraction of the training cycle), the DSP adjusts the current source to increase the output voltages from the transimpedance circuit. Likewise, if the output voltage differential from the transimpedance circuit exceeds a predetermined threshold level, the DSP adjusts the current source to decrease the output voltages from the transimpedance circuit. If the peak is remains too large, the DSP decreases the current from source 180 to increase the current conducted through transistor 192. FIG. 7b illustrates a digital current source 252 having inputs C0–Cn that can be used as current source 194 and operates in a similar manner to source 250.

In one embodiment, the adjustable current source is controlled in real-time such that the feedback voltage control signal is adjusted during operation. In an alternate embodiment, the adjustable current source is adjusted at the beginning of operation and remains set at its initial (fixed) level throughout operation. In this embodiment, the current source is adjusted during a calibration mode that can be executed during a training or preamble of the circuit operation.

Figure 8:
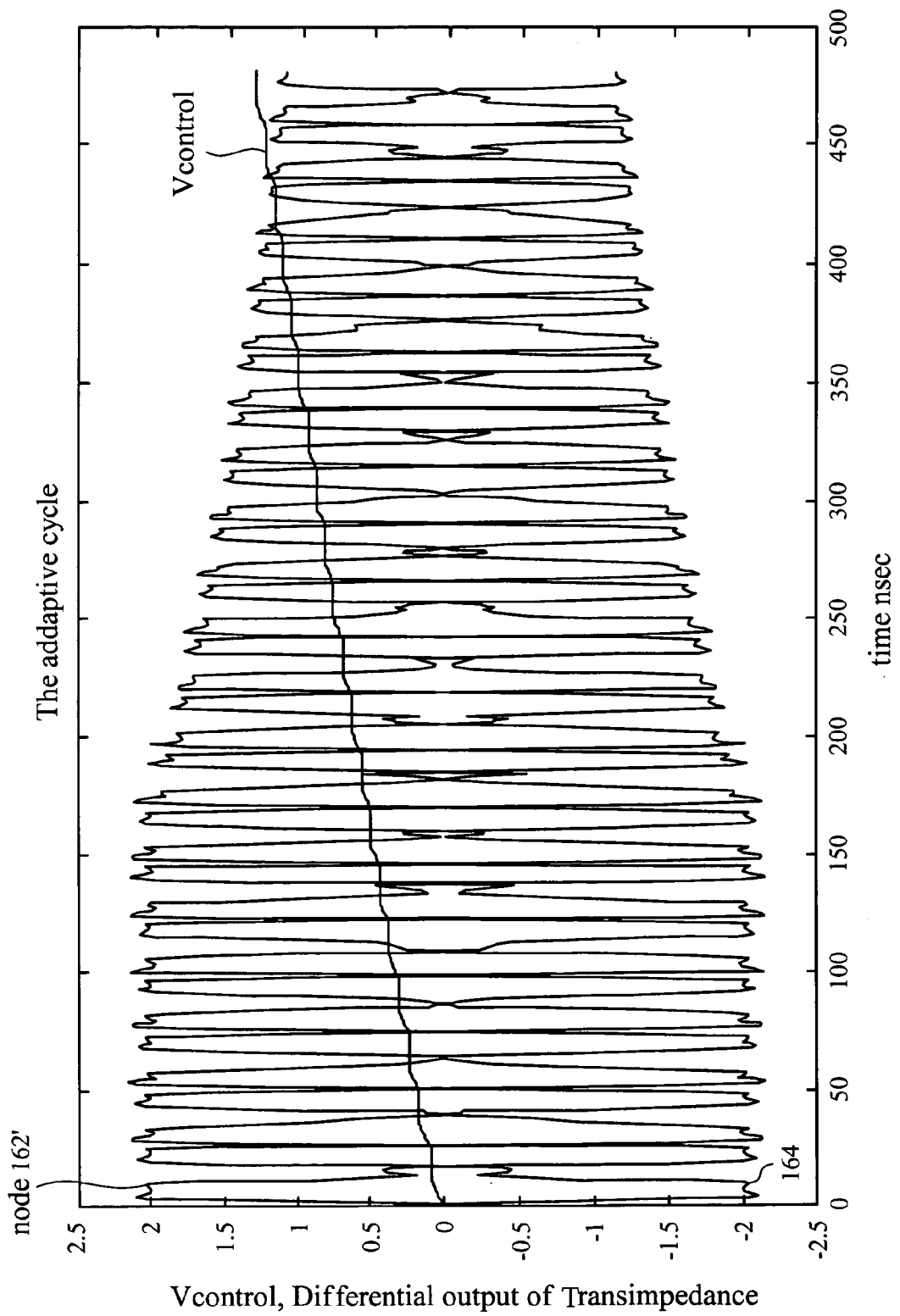
FIG. 8 is a simulation diagram is provided to illustrate operation of one embodiment of the present invention.

Referring to FIG. 8, a simulation diagram is provided to illustrate operation of the circuit of FIG. 6. The x-axis indicated time and the y-axis indicates voltage. It is noted that the present invention does not clamp the output voltages, but operates in the linear region so that the characteristics of these voltage signals are maintained. In FIG. 8, the differential voltage signals provided at nodes 162 and 164 are illustrated. At time zero, the peak-to-peak differential voltage is about 4 volts (2 to −2 volts). The charge on capacitor 192 is at zero volts. The capacitor charge increases and the peak-to-peak differential voltage decreases. The peak-to-peak differential voltage approaches 2 volts at 500 ns.

Figure 9:
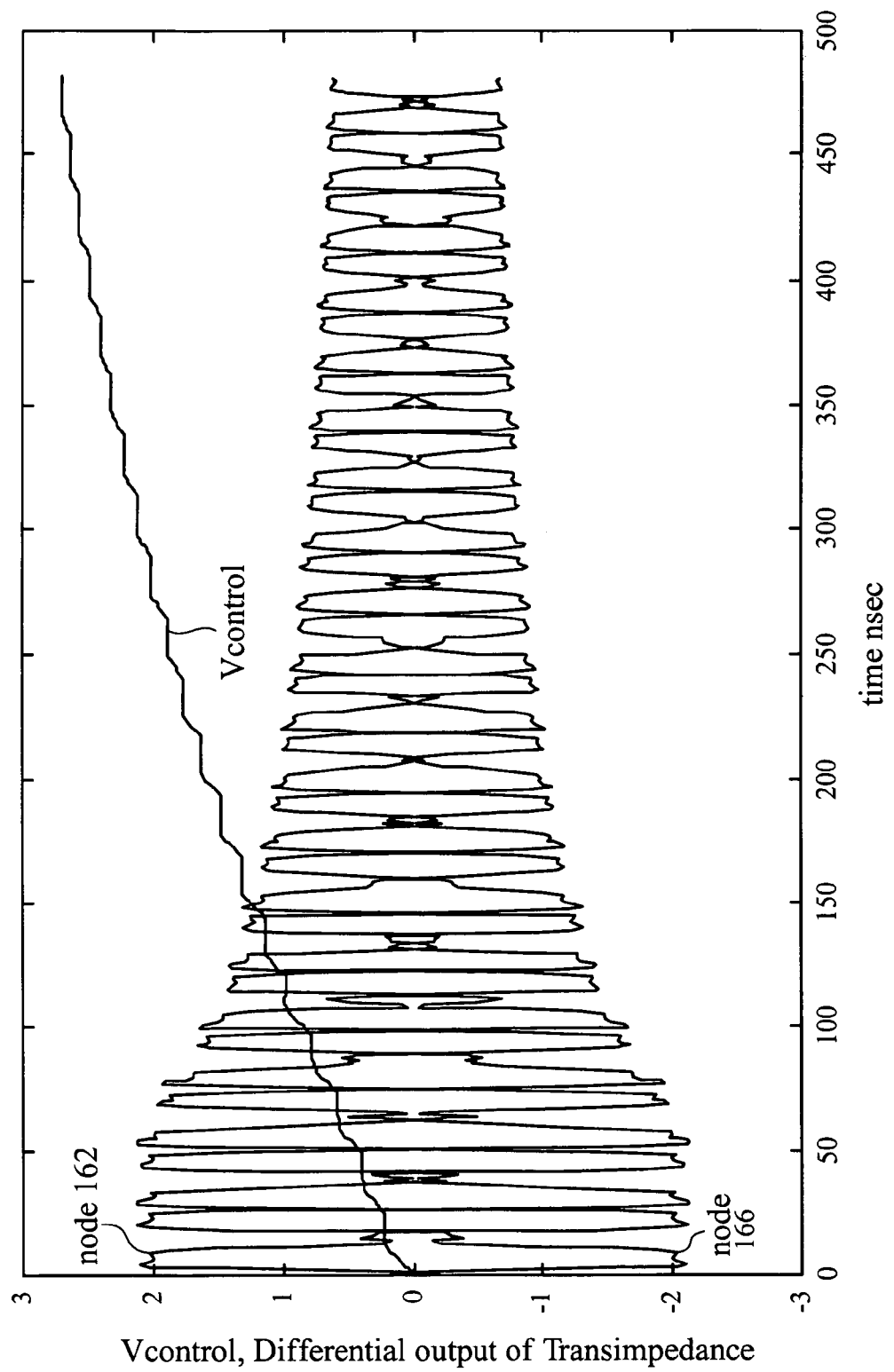
FIG. 9 is another simulation diagram.

In FIG. 9, the differential voltage signals provided at nodes 162 and 164 are illustrated and at time zero, the peak-to-peak differential voltage is about 4 volts. The charge on capacitor 192 is at zero volts. The capacitor charge increases and the peak-to-peak differential voltage decreases. In this embodiment, the ratio of transistor 190 to transistor 174 has been increased compared to the embodiment of FIG. 8. The current mirror ratio, therefore, has been changed. Thus, the charge on capacitor 192 increases more rapidly and the peak-to-peak differential voltage is below 2 volts at 500 ns.

Figure 10:
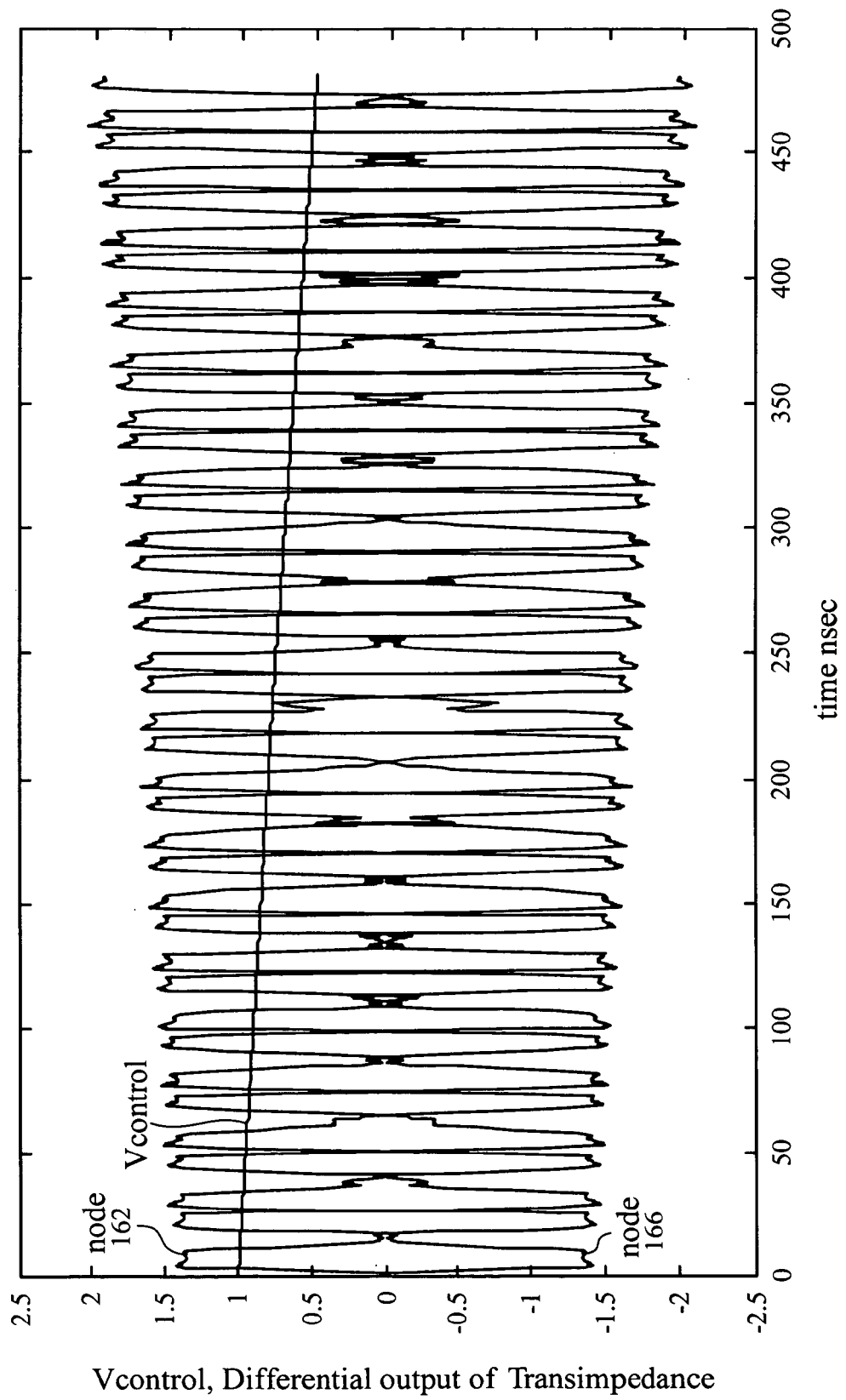
FIG. 10 is yet another simulation diagram.

In FIG. 10, the differential voltage signals provided at nodes 162 and 164 are illustrated and at time zero, the peak-to-peak differential voltage is about 3 volts. The charge on capacitor 192 is at one volt. An optional precharge circuit 220, see FIG. 6, can be used to provide an initial charge on the capacitor. The capacitor charge decreases and the peak-to-peak differential voltage increases. The change in capacitor charge can be implemented in two ways. First, the current supplied by controllable source 180 can be increased to reduce the charge on capacitor 192. As such, the peak-to-peak differential voltage increases to about 4 volts at 500 ns. The charge on capacitor 192 can also be reduced by adjusting the discharge current through source 194. Current source 194, therefore, can be fixed or programmable to adjust the decay current for active adjustment. By adjusting the decay current the refresh period of capacitor 192 can be controlled. The current sources 180 and 194 are used in conjunction to provide a balance. That is, source 180 can increase or decrease the charging current to capacitor 192 and source 194 can increase or decrease the discharge current for capacitor 192.

CONCLUSION

A balanced peak detector circuit has been described that adjusts differential voltage signals. In one embodiment, the peak detector uses competing current paths to provide a charging current to a storage capacitor. The charge on the storage capacitor is used to adjust either a transconductance or a transimpedance circuit. An offset current can be used to adjust the charge stored on the capacitor to change a peak-to-peak output voltage from the transimpedance circuit. In one embodiment, the offset current can be adjusted using an adjustable current source. A discharge circuit has been described that allows a discharge of the capacitor to be controlled.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A signal processing circuit comprising:
   a voltage processor having first and second input nodes to receive differential input voltage signals, and first and second output nodes to provide first and second differential output signals of the signal processing circuit having a first peak-to-peak voltage; and
   a peak detector circuit coupled to the first and second output nodes of the voltage processor, the peak detector circuit has an output node to provide a feed back signal to the voltage processor to adjust the first peak-to-peak voltage of the differential output signals, the peak detector circuit comprises:
   a storage device to store the feed back signal;
   a first current path controlled by the first differential output signal;
   a second current path controlled by the second differential output signal; and
   a current mirror coupled to mirror a current conducted through the second current path, the storage device is a capacitor coupled to the current mirror to store a charge representative of the current conducted through the second current path.

2. The signal processing circuit of claim 1 wherein the peak detector circuit further comprises:
   a programmable current source coupled to the second current path.

3. The signal processing circuit of claim 2 wherein the programmable current source is controlled by a digital signal processor.

4. The signal processing circuit of claim 1 further comprising a programmable decay current source coupled to the storage device to provide a discharge path for the storage device.

5. The signal processing circuit of claim 1 wherein the voltage processor comprises:
   a transconductance circuit coupled to the first and second input nodes to transform the differential input voltage signals to differential current signals; and a controllable transimpedance circuit coupled to receive the differential current signals, the controllable transimpedance circuit is coupled to the first and second output nodes to provide the first and second differential output signals based on the feed back signal.

6. The signal processing circuit of claim 1 wherein the peak detector circuit comprises:
first and second input transistors;
a first source transistor coupled between the first input transistor and a supply voltage node;
a second source transistor coupled between the second input transistor and the supply voltage node;
a first current source coupled between the first and second input transistors and a ground node, wherein the first input transistor, first source transistor and first current source are coupled in series to define the first current path, and the second input transistor, second source transistor and first current source are coupled in series to define the second current path; and
a programmable current source coupled to the second input transistors to provide an offset current to the second current path.

7. The signal processing circuit of claim 6 further comprising a programmable decay current source coupled to the capacitor to provide a discharge path for the capacitor.

8. The signal processing circuit of claim 6 further comprising a digital signal processor coupled to the programmable current source to control the offset current.

9. A signal processing circuit comprising:
a transconductance circuit coupled to first and second input nodes to transform differential input voltage signals to differential current signals; and
a controllable transimpedance circuit coupled to receive the differential current signals, the controllable transimpedance circuit has first and second output nodes to provide first and second differential output signals having a first peak-to-peak voltage; and
a peak detector circuit coupled to the first and second output nodes of the controllable transimpedance circuit, the peak detector circuit has an output node to provide a feed back signal to the controllable transimpedance circuit to adjust the first peak-to-peak voltage of the differential output signals, the peak detector circuit comprises:
a capacitor to store the feed back signal;
a first current path controlled by the first differential output signal;
a second current path controlled by the second differential output signal;
a current mirror coupled to mirror a current conducted through the second current path, the capacitor is coupled to the current mirror to store a charge representative of the current conducted through the second current path; and
a programmable decay current source coupled to the capacitor to provide a discharge path for the capacitor.

10. The signal processing circuit of claim 9 wherein the peak detector circuit further comprises:
first and second input transistors;
a first source transistor coupled between the first input transistor and a supply voltage node;
a second source transistor coupled between the second input transistor and the supply voltage node; and
a first current source coupled between the first and second input transistors and a ground node, wherein the first input transistor, first source transistor and first current source are coupled in series to define the first current path, and the second input transistor, second source transistor and first current source are coupled in series to define the second current path.

11. The signal processing circuit of claim 9 wherein the programmable current source is controlled by a digital signal processor.

12. An integrated circuit data receiver comprising:
first and second input nodes to receive differential input voltage signals having a first peak-to-peak voltage;
a voltage processor coupled to the first and second input nodes, the voltage processor has first and second output nodes to provide first and second differential output signals having a second peak-to-peak voltage; and
a peak detector circuit coupled to the first and second output nodes of the voltage processor, the peak detector circuit has an output node to provide a feed back signal to the voltage processor to adjust the first peak-to-peak voltage of the differential input signals to the second peak-to-peak voltage, the peak detector circuit comprises:
a storage device to store the feed back signal;
first and second input transistors;
a first source transistor coupled between the first input transistor and a supply voltage node;
a second source transistor coupled between the second input transistor and the supply voltage node;
a first current source coupled between the first and second input transistors and a ground node, wherein the first input transistor, first source transistor and first current source are coupled in series to define a first current path, and the second input transistor, second source transistor and first current source are coupled in series to define a second current path;
a programmable current source coupled to the second current path to provide an offset current and adjust the current conducted through the second current path;
a current mirror transistor coupled to the second source transistor to mirror the current conducted through the second source transistor;
a capacitor coupled to the current mirror transistor to store a charge representative of the current conducted through the second source transistor; and
a programmable decay current source coupled to the capacitor to provide a discharge path for the capacitor.

13. The integrated circuit data receiver of claim 12 wherein the voltage processor comprises:
a transconductance circuit coupled to the first and second input nodes to transform the differential input voltage signals to differential current signals; and
a transimpedance circuit coupled to receive the differential current signals, the transimpedance circuit is coupled to the first and second output nodes to provide the first and second differential output signals, wherein the transimpedance circuit can be adjusted by the feed back signal.

14. An integrated circuit data receiver comprising:
first and second input nodes to receive differential input voltage signals having a first peak-to-peak voltage;
a transconductance circuit coupled to the first and second input nodes to transform the differential input voltage signals to differential current signals;
a transimpedance circuit coupled to receive the differential current signals, the transimpedance circuit is coupled to first and second output nodes to provide first and second differential output signals having a second peak-to-peak voltage; and a peak detector circuit comprising:
first and second input transistors coupled to the first and second output nodes;
a first source transistor coupled between the first input transistor and a supply voltage node;
a second source transistor coupled between the second input transistor and the supply voltage node;
a first current source coupled between the first and second input transistors and a ground node, wherein the first input transistor, first source transistor and first current source are coupled in series, and the second input transistor, second source transistor and first current source are coupled in series;
a programmable current source coupled to an common node with the second input transistor and the second source transistor to provide an offset current and adjust the current conducted through the second source transistor;
a current mirror transistor coupled to the second source transistor to mirror the current conducted through the second source transistor;
a capacitor coupled to the current mirror transistor to store a charge representative of the current conducted through the second source transistor; and
a programmable decay current source coupled to the capacitor to provide a discharge path for the capacitor.

15. A communication system comprising:
a data bus;
a transmitter coupled to a first location of the data bus to transmit data signals, the data signal comprises complementary voltage signals; and
a receiver circuit coupled to a second location of the data bus, the receiver circuit including:
a voltage processor having first and second input nodes to receive the complementary voltage signals, and first and second output nodes to provide first and second differential output signals; and
a peak detector circuit coupled to the first and second output nodes of the voltage processor, the peak detector circuit has an output node to provide a feed back signal to the voltage processor to adjust the peak-to-peak voltage of the first and second differential output signals, the peak detector circuit includes: a storage device to store the feed back signal; a first current path controlled by the first differential output signal;
a second current path controlled by the second differential output signal; and
a current mirror coupled to mirror a current conducted through the second current path, the storage device is a capacitor coupled to the current mirror to store a charge representative of the current conducted through the second current path.

16. The communication system of claim 15 wherein the voltage processor further comprises:
a transconductance circuit to transform the complementary voltage signals to differential current signals; and
a transimpedance circuit coupled to receive the differential current signals, the transimpedance circuit provides the first and second differential output signals.

17. The communication system of claim 15 wherein the refresh circuit is a controllable current source.

18. A method of adjusting voltage signals, the method comprising:
detecting a first peak-to-peak voltage level of first and second differential input voltage signals;
storing a charge on a capacitor representative of the first peak-to-peak voltage level of differential voltage signals; and
adjusting a second peak-to-peak voltage level of first and second differential output voltage signals using the charge stored on the capacitor wherein the detecting the first peak-to-peak voltage level includes:
controlling a first current path of a detector circuit with the first differential input voltage signal;
controlling a second current path of the detector circuit with the second differential input voltage signal, such that a differential in currents through the first and second current paths represents the first peak-to-peak voltage level; and
mirroring the current conducted through the second current path and coupling the mirrored current to the capacitor to charge the capacitor.

19. The method of claim 18 further comprising:
injecting an offset current into the second current path to adjust the current coupled to the capacitor.

20. The method of claim 18 further comprising coupling a discharge circuit to the capacitor to allow periodic refresh of the charge stored on the capacitor.

21. The method of claim 18 wherein detecting the first peak-to-peak voltage level comprises:
activating a first input transistor in response to the first differential input voltage signal to conduct current through a first source transistor, the first input transistor is coupled to a first current source; and
activating a second input transistor in response to the second differential input voltage signal to conduct current through a second source transistor, the second input transistor is coupled to the first current source, such that a differential in currents conducted through the first and second source transistors represents the first peak-to-peak voltage level of the first and second differential input voltage signals.

22. The method of claim 21 wherein storing the charge on the capacitor comprises:
coupling a charging current from a current mirror transistor to the capacitor, the charging current is substantially equal to the current conducted through the second source transistor.

23. The method of claim 22 further comprising:
coupling an offset current to the second input transistor to change the current conducted through the second source transistor.

24. The method of claim 18 wherein the first and second differential input voltage signals are received by a transconductance circuit and the first and second differential output voltage signals are provided by a transimpedance circuit coupled to outputs of the transconductance circuit, and wherein adjusting the second peak-to-peak voltage level comprises:
adjusting either a transconductance level or a transimpedance level of the transconductance circuit or the transimpedance circuit.

* * * * *